United States Patent [19]

Grabbe et al.

[11] Patent Number: 4,587,548
[45] Date of Patent: May 6, 1986

[54] LEAD FRAME WITH FUSIBLE LINKS

[75] Inventors: Dimitry G. Grabbe, Lisbon Falls, Me.; Richard C. Downs, Elizabethtown, Pa.

[73] Assignee: AMP Incorporated, Harrisburg, Pa.

[21] Appl. No.: 459,436

[22] Filed: Jan. 20, 1983

Related U.S. Application Data

[63] Continuation-in-part of Ser. No. 371,837, Apr. 26, 1982, abandoned.

[51] Int. Cl.⁴ .................... H01L 23/12; H01L 23/48
[52] U.S. Cl. ........................................ 357/70; 357/68; 357/80
[58] Field of Search ............................ 357/70, 68, 80

[56] References Cited

U.S. PATENT DOCUMENTS

| | | | |
|---|---|---|---|
| 3,548,494 | 12/1970 | Haring | 357/74 |
| 3,564,354 | 2/1971 | Aoki et al. | 357/68 |
| 3,691,290 | 9/1972 | Napier | 174/68.5 |
| 4,023,053 | 5/1977 | Shimizu et al. | 357/72 |
| 4,032,949 | 6/1977 | Bierig | 357/68 |
| 4,234,666 | 11/1980 | Gursky | 357/68 |
| 4,362,902 | 12/1982 | Grabbe | 174/527 P |
| 4,380,042 | 4/1983 | Angelucci, Sr. et al. | 357/70 |
| 4,408,218 | 10/1983 | Grabbe | 357/70 |

FOREIGN PATENT DOCUMENTS 0059092 9/1982 European Pat. Off. .
0063408 10/1982 European Pat. Off. .

*Primary Examiner*—Andrew J. James
*Assistant Examiner*—S. V. Clark
*Attorney, Agent, or Firm*—F. Brice Faller

[57] ABSTRACT

Copper lead frame for manufacturing a semiconductor chip carrier has signal leads extending from outer leads about the periphery of the frame and temporarily attached to a ground bus toward the center of the frame by fusible links. Ground leads extend from bus alternately with signal leads and have fusible links at outer leads which are melted to isolate them from signal leads and eliminate noise between signal leads in finished carrier. A power bus located within the ground bus and a chip mounting pad located with the power bus are similarly positioned by fusible links.

7 Claims, 8 Drawing Figures

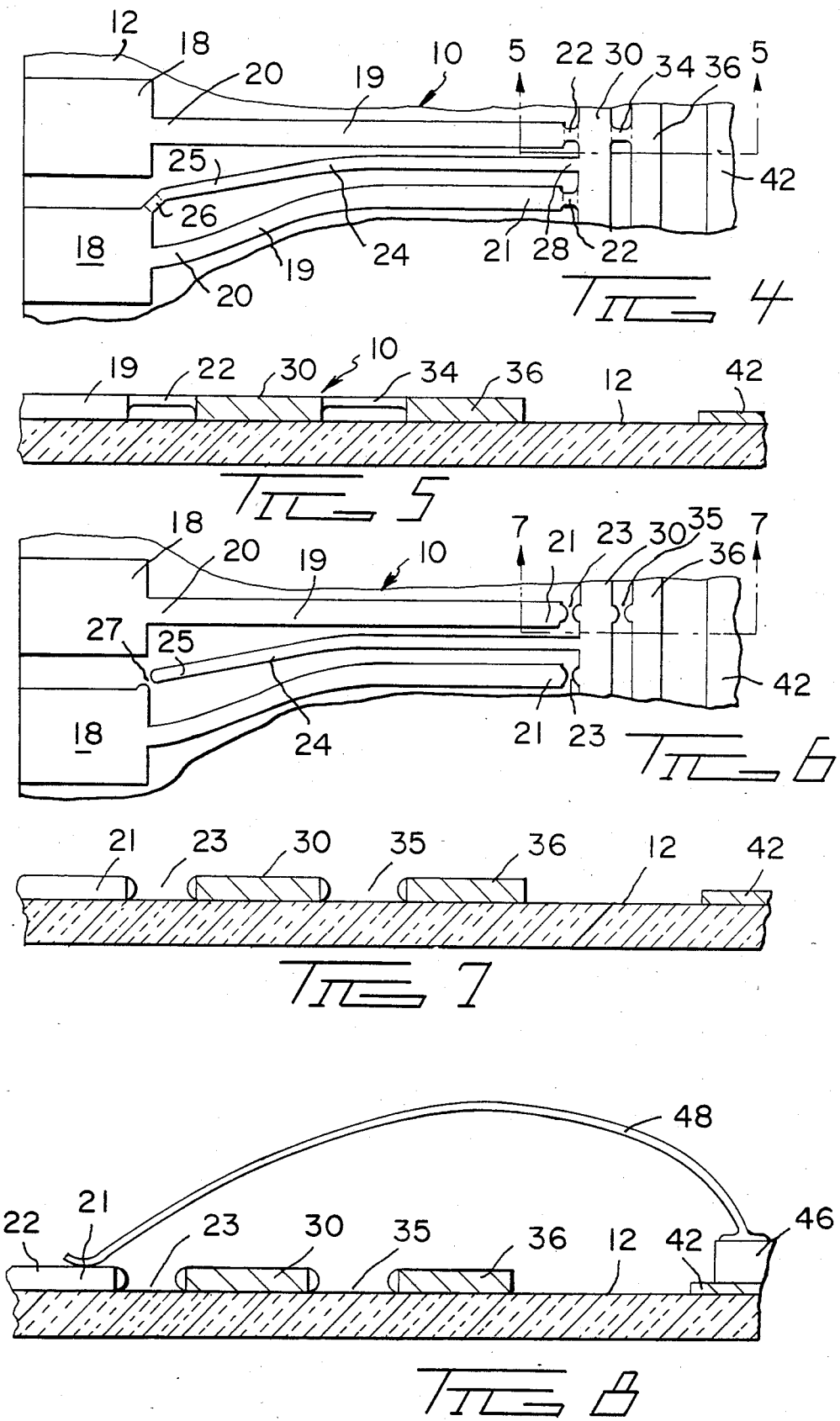

LEAD FRAME WITH FUSIBLE LINKS

This application is a continuation-in-part of U.S. application Ser. No. 371,837 filed Apr. 26, 1982, now abandoned.

FIELD OF THE INVENTION

The present invention relates to a process for manufacturing a semiconductor chip carrier wherein the signal leads are accurately positioned by temporary attachment among themselves or to a bus.

THE PRIOR ART

In the formation of ceramic chip carriers, lead frames are normally bonded to the ceramic substrate by well-known methods with subsequent connections being made to the leads of the lead frame from appropriate pads on semiconductor chips secured to the ceramic substrate. These connections from the pads on the chip to the leads of the lead frame are made manually or by means of automatic wire bonding machinery or by mass bonding techniques using "spider" tape. The automatic wire bonding machinery is normally computer operated on an x-y coordinate basis and it is therefore necessary that the leads of the lead frame be accurately positioned on the substrate so that wiring is run from pads on the semiconductor chip to the appropriate lead on the lead frame. Due to the fact that leads are thin and have high resistance, it has been necessary in prior art lead frames to use a plurality of leads to provide power and ground voltages to the appropriate pads on the chip. Since the number of leads in the lead frame is limited, the number of signal connections is thus reduced. Another problem of the prior art is that of providing shielding against interference between adjacent signal leads.

There is disclosed in U.S. Pat. No. 4,362,902 a copper oxide surfaced lead frame for manufacturing a semiconductor chip carrier, the lead frame having a planar surface which is to be bonded to a ceramic substrate, the lead frame comprising a plurality of outer leads extending to a plurality of locations about the periphery of the lead frame and a plurality of signal leads extending from the outer leads toward the center of the lead frame, each signal lead having a first end attached to a respective outer lead and a second end attached to support means toward the center of the lead frame. A similar scheme is disclosed in U.S. Pat. No. 4,408,281; both utilize support means in the form of an integral common rim overlying the substrate. A related scheme is disclosed in U.S. Pat. No. 4,445,271, which further discloses a ground pad attached to the support rim in the center of the lead frame. In all of the above schemes, the common rim is removed after bonding the lead frame to the substrate.

SUMMARY OF THE INVENTION

According to the instant invention, therefore, a lead frame for manufacturing a semiconductor chip carrier is characterized in that the support means is a ground bus which is to be bonded to said ceramic substrate, the ground bus having a planar surface which is coplanar with the planar surface of the lead frame. Each signal lead having a neck portion proximate to the second end, the neck portion being of smaller cross section than the rest of the signal lead, the neck portion being recessed from said planar surface, whereby, upon bonding the lead frame to the substrate, the neck portion will not bond thereto. The neck portions may be fused by heating, which is the preferred method where the lead frame has a copper oxide surface, or by passing an electric current selectively through the neck portions, causing them to melt in the manner of a fusible link.

The invention therefore assures that the second ends of all signal leads will be accurately spaced relative to each other during the bonding process. As the neck portions are fused to leave gaps, the need for removing the support means is eliminated. As the support means is in the form of a ground bus, the need for discrete ground leads for the chip is eliminated. The provision of ground leads which alternate with the signal leads and extend from the ground bus toward the outer leads, with fusible links thereat, further provides for interference shielding between signal leads. A power bus and ground pad for mounting the semiconductor chip may be similarly incorporated in the lead frame with fusible links between the power bus and the ground bus, and between the power bus and ground pad.

The lead frame of the present invention thus provides several advantages over prior lead frames in a single package, and the chip carrier using same can be manufactured in a one-step process which simultaneously bonds the frame to a ceramic substrate and separates the component circuit parts by fusing links therebetween.

BRIEF DESCRIPTION OF THE DRAWINGS

FIG. 4 is a plan view of part of the lead frame on the substrate prior to bonding and melting the fusible links.

FIG. 5 is a section view taken along line 5—5 of FIG. 4.

FIG. 6 is a plan view of part of the lead frame on the substrate after bonding and melting the fusible links.

FIG. 7 is a section view taken along line 7—7 of FIG. 6.

FIG. 8 is a section view similar to FIG. 7 after placing a semiconductor chip and performing wire bonding.

DETAILED DESCRIPTION OF THE PREFERRED EMBODIMENT

Figure 1:
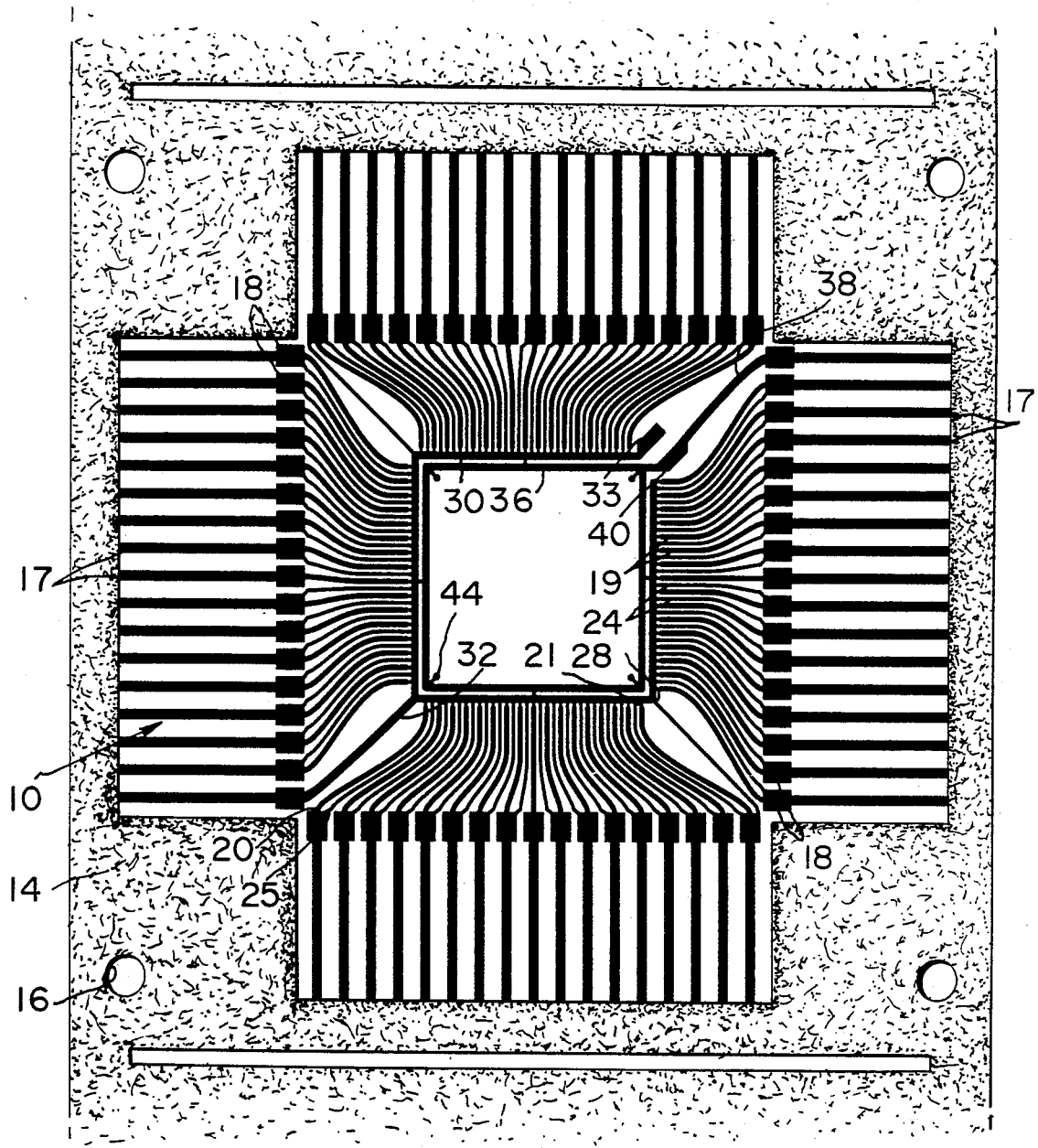
FIG. 1 is a plan view of the lead frame in strip form.

FIG. 1 depicts the lead frame 10 of the present invention as manufactured integrally with carrier strip 14. The stippled portions as well as the solid black portions represent copper sheet; a ground pad 42 (shown in FIG. 2) has been deleted from this view for clarity. Salient features of the lead frame 10 are the outer leads 17 having pads 18, signal leads 19, and ground leads 24 which alternate with signal leads 19. All signal leads 19 and ground leads 24 extend from pads 18 to a ground bus 30, which is connected to an outer lead 17 by main ground lead 32. Each signal lead has a first end 20 connected to the pad portion 18 of an outer lead 17, and a second end 21 connected to the ground bus 30. Each ground lead 24 likewise has a first end 24 connected to pad 18 and a second end 27 connected to the ground bus 30. A power bus 36 is situated internally of the ground bus 30 and is connected to an outer lead 17 by the main power lead 38. Decoupling pads 33, 40 are formed integrally with the ground and power buses 30, 36 respectively and serve as mounting points for a decoupling capacitor in the finished chip carrier. The lead frame 10 is manufactured by a standard etching process wherein copper strip is coated with photo resist and exposed to ultraviolet light to cure it where it is desired to leave copper. Remaining (uncured) resist is washed away and the copper in areas left unprotected by cured resist is etched away with acid. The areas unprotected by resist are different on opposite sides of the lead frame 10 so that etching only partially through the copper from one side may be achieved. Where adjacent areas on opposite sides are unprotected, etching through is achieved. Indexing holes 16 are provided in the carrier strip 14 so that exposure and etching may be accomplished in a step wise operation.

Figure 2:
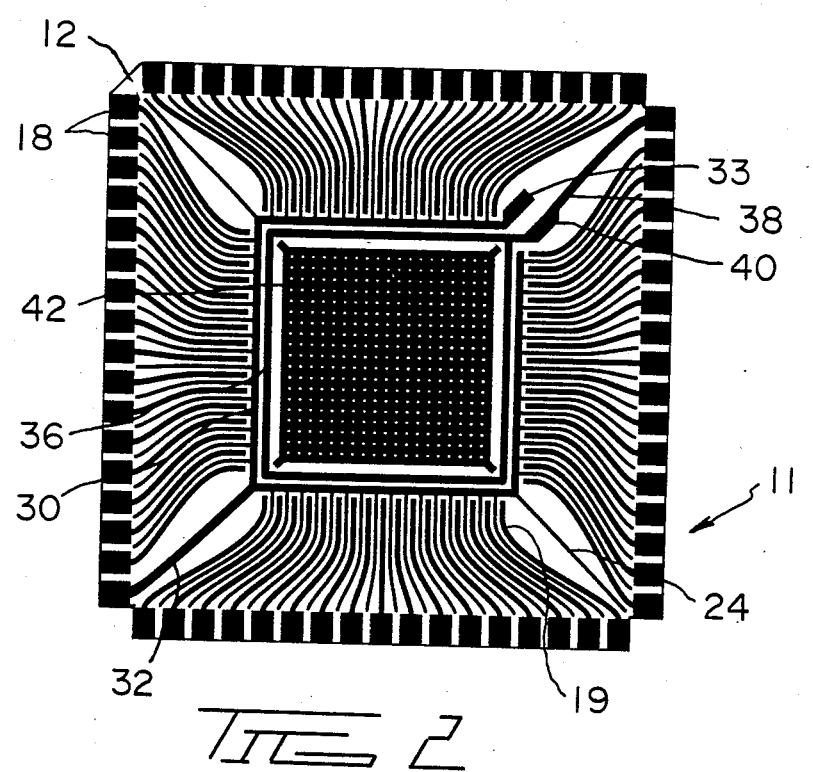
FIG. 2 is a plan view of a finished chip carrier.

FIG. 2 depicts a finished chip carrier 11; the lead frame 10 is bonded to a ceramic substrate 12 by any of the procedures described in U.S. Pat. Nos. 3,744,120 (Burgess et al), 3,766.634 (Babcock et al), 3,854,892 (Burgess et al), 3,911,553 (Burgess et al), 3,994,430 (Cusano et al), and 4,129,243 (Cusano et al).

The processes involve bonding a metallic member to a non-metallic substrate by means of a bonding agent in the form of a eutectic composition at the interface. The preferred materials in the context of the present invention are a copper lead frame and a ceramic substrate of alumina or beryllia, the bonding agent therefor being copper oxide according to the teachings of the above patents. The copper oxide may be formed on the lead frame 10 most conveniently by heating the entire lead frame in a reactive atmosphere containing oxygen, or by applying particulate copper oxide in an appropriate vehicle to one of the interface surfaces. The lead frame is placed in contact with the ceramic and heated to just below the melting point of the copper, which forms a copper-copper oxide eutectic melt at the interface which wets both the lead frame and the substrate. Upon cooling, the melt bonds the copper to the substrate. The amount of eutectic composition is so small that, for thermal and electrical purposes, the bond behaves essentially as if it were metal and ceramic. The outer portions of outer leads 17 (FIG. 1) may be sheared off to leave only pads 18 as shown so that the chip carrier 11 may be plugged into a socket mounted on a circuit board, or the leads 17 (FIG. 1) may be bent under the substrate 12 to form legs which may then be soldered to a circuit board.

Figure 3:
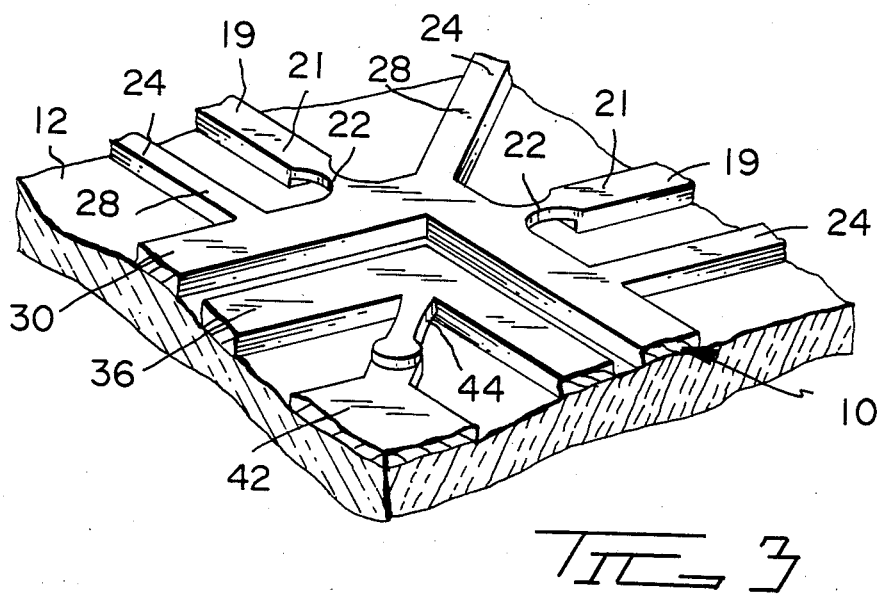
FIG. 3 is a perspective of a portion of the lead frame prior to bonding and melting the fusible links.

FIG. 3 is a perspective of a corner of the ground bus 30 and power bus 36 after the lead frame 10 has been placed against the substrate 12 but prior to bonding. Here neck portions for fusible links 22 at second ends 21 of signal lead 19 are apparent; the links 22 are recessed from the planar surface 13 (FIG. 5) of the lead frame 10 which bonds to the substrate 12 and thus do not bond thereto. A similar neck portion or fusible link 44 connects the power bus 36 and chip support pad 42. Where the oxide has been formed on the entire lead frame, the fusible links 22, 44 melt during bonding of the lead frame 10 due to the higher ratio of copper oxide to copper in the cross section of the fusible links.

Where the oxide is only present at the contact interface between the lead frame and the substrate, as in the case where particulate is deposited on the substrate, the fusible links 22 remain pure copper and thus will not melt during the bonding of the lead frame 10 to the substrate 12. Links may then be individually fused by placing electrodes on either side thereof and passing sufficient current therethrough to melt the link 22 in the manner of a fuse. This procedure is not as simple as mass fusing oxide-coated links 22 by heating, but offers the advantage of enabling finer lead geometry. Oxidization of the lead frame causes a slight volume swell of the leads which, in the case of fine clearances, could cause fusing together during the heating process, the fusing being facilitated by the higher oxide to metal ratio in the fine leads and resultant eutectic melt.

Details of other neck portions or fusible links and the melting thereof are depicted in FIGS. 4 through 7. FIG. 4 is a plan view of a portion of the lead frame 10 and substrate 12 in the area where ground bus 30 is connected to power bus 36 by first link or fusible link 22. Note that the ground lead 24 has neck portion or fusible link 26 at first end 25 where the lead 24 attaches to pad 18. While the link 26 is not narrower than the lead 24 in plan view, it is recessed from the substrate 12 in the manner of links 22 and 44 described in conjunction with FIG. 3. All links 22, 26, 34, and 44 are similar in cross section and referred to generally as neck portions. FIG. 5 is a cross section which depicts a portion of the signal lead 19 where it attaches to ground bus 20 via link 22, and also shows the link 34 attaching ground bus 30 to power bus 36.

FIG. 6 is a plan view similar to FIG. 4 after bonding the lead frame 10 to the substrate 12 and fusing links 22, 26, and 34, leaving gaps 23, 27, and 35 as shown, isolating the signal leads 19 from the ground bus 30, isolating the ground bus 30 and ground leads 24 from the pads 18, and further isolating the ground bus 30 from the power bus 36. The ground leads 24 which alternate with signal leads 19 are thus electrically isolated therefrom and provide electromagnetic shielding so that the finished chip carrier will be of a "low cross-talk" design.

FIG. 8 shows a semiconductor chip 46 mounted on the chip mounting pad 42 and wire bonded to the second end 21 of a signal lead 22. Additional wire bond connections (not shown) are made between the ground bus 30 and the chip 46, as well as between the power bus 36 and the chip 46.

While the foregoing description has been directed to a lead frame for a carrier for a single semiconductor chip, it should be apparent to one skilled in the art that the fusible link principle described has broader application. For example, several chips on a single ceramic substrate may be interconnected by a network of leads whose spacing is maintained by fusible links therebetween which melt as the network is bonded to the substrate and thus isolate leads in different sections of the network.

We claim:

1. A metallic lead frame for manufacturing a semiconductor chip carrier, said lead frame having a planar surface which is to be bonded to a ceramic substrate, said lead frame comprising plurality of outer leads extending to a plurality of locations about the periphery of the lead frame and a plurality of signal leads extending from said outer leads toward the center of said lead frame, each said signal lead having a first end attached to a respective outer lead and a second end attached to support means toward the center of said lead frame, each said signal lead having a neck portion proximate to said second end, said neck portion being of smaller cross section than the rest of the signal lead, characterized in that the support means is a ground bus which is to be bonded to said ceramic substrate, said ground bus having a planar surface which is coplanar with the planar surface of said lead frame, said neck portion being recessed from said planar surfaces, whereby, upon bonding said lead frame to said substrate, said neck portion will not be bonded to said substrate.

2. A lead frame as in claim 1 characterized in that said metallic lead frame is copper and has a copper oxide surface, the cross-sectional area of said neck portions being such that the ratio of copper oxide to copper in said neck portion will cause a eutectic melting of said neck portion at a temperature lower than the melting point of the copper, whereby the neck portions wil melt in the manner of fusible links as the lead frame is heated to bond it to the substrate.

3. A lead frame as in claim 1 characterized in that said metallic lead frame is bare copper, whereby the leads can have very small cross sections without melting at less than the melting point of copper.

4. A lead frame as in claim 1 characterized in that said lead frame further comprises a power bus located toward the center of said lead frame internally of said ground bus, said power bus having a planar surface coplanar with the planar surface of the lead frame, said power bus being connected to said ground bus by a plurality of neck portions, said neck portions being of a cross section comparable to that of said neck portions of said signal leads and likewise recessed from said planar surface.

5. A lead frame as in claim 4 characterized in that said lead frame further comprises a ground pad located in the center of said lead frame internally of said power bus, said ground pad having a planar surface coplanar with the planar surface of the lead frame, said ground pad being connected to said power bus by a plurality of neck portions, said neck portions being of a cross section comparable to that of said neck portions of said signal leads and likewise recessed from said planar surface.

6. A lead frame as in claim 5 wherein the first end of at least some of said ground leads is attached to a common outer lead with the adjacent signal lead.

7. A lead frame as in claim 1 characterized in that said lead frame further comprises a plurality of ground leads extending from said outer leads to said ground bus alternately with said signal leads, said ground leads each having a planar surface which is coplanar with the planar surface of said lead frame, each said ground lead having a first end attached to a respective outer lead and a second end attached to said ground bus, each said ground lead having a neck portion proximate to said first end, said neck portion being of smaller cross section than the rest of said ground lead, said neck portion being recessed from said planar surface, whereby, upon bonding said lead frame to said substrate said neck portion will not bond thereto, and upon melting said neck portion to leave a gap between each said ground lead and the respective outer lead, said ground leads will be at a common potential with said ground bus and provide electromagnetic shielding between said signal leads in the finished chip carrier.

* * * * *